United States Patent
Beitel et al.

(10) Patent No.: US 6,552,385 B2
(45) Date of Patent: Apr. 22, 2003

(54) DRAM MEMORY CAPACITOR HAVING THREE-LAYER DIELECTRIC, AND METHOD FOR ITS PRODUCTION

(75) Inventors: Gerhard Beitel, München (DE); Martin Franosch, München (DE); Thomas Peter Haneder, München (DE); Gerrit Lange, München (DE); Hans Reisinger, Grünwald (DE); Herbert Schäfer, Höhenkirchen-Siegertsbrunn (DE); Stephan Schlamminger, Zürich (CH); Hermann Wendt, Grasbrunn (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/756,082

(22) Filed: Jan. 8, 2001

(65) Prior Publication Data

US 2001/0031526 A1 Oct. 18, 2001

Related U.S. Application Data

(63) Continuation of application No. PCT/DE99/01977, filed on Jul. 1, 1999.

(30) Foreign Application Priority Data

Jul. 6, 1998 (DE) .......................... 198 30 155

(51) Int. Cl.[7] ............................................. H01L 27/108
(52) U.S. Cl. .................. 257/310; 257/296; 257/304; 257/306; 257/311
(58) Field of Search ............................... 257/296, 304, 257/306, 310

(56) References Cited

U.S. PATENT DOCUMENTS

5,731,220 A * 3/1998 Tsu et al. ................. 361/321.5
5,834,060 A  11/1998 Kawahara et al.
6,362,068 B1 * 3/2002 Summerfelt et al. ........ 438/244

OTHER PUBLICATIONS

W. Hönlein. et al.: "ONO Technology", *Applied Surface Science*, vol. 39, 1989, pp. 178–191.

F.Tcheliebou et al.: "On the microstructure and optical properties of $Ba_{0.5}Sr_{0.5}TiO_3$ films", *Thin Solid Films*, vol. 299, 1997, pp. 14–17.

International Publication WO 96/01493 (Azuma et al.), dated Jan. 16, 1996.

Yutaka Takeshima et al.: "Preparation and Dielectric Properties of the Multilayer Capacitor with (BaSr) $TiO_3$ Thin Layers by Metalorganic Chemical Vapor Deposition", Jpn. J. Appl. Phys., vol. 36 (1997), pp. 5870–5873.

H. Reisinger et al.: "Dielectric Breakdown, Reliability and Defect Density of $(Ba_{0.7}Sr_{0.3})TiO_3(BST)$", 1998 Symposium on VLSI Technology Digest of Technical Papers, XP–002124708, pp. 58–59.

* cited by examiner

Primary Examiner—Eddie Lee
Assistant Examiner—Matthew E. Warren
(74) Attorney, Agent, or Firm—Laurence A. Greenberg; Werner H. Stemer; Gregory L. Mayback

(57) ABSTRACT

A DRAM capacitor is described that contains a $BaSrTiO_3$ (BST) dielectric. The dielectric has a three-layer structure enabling the formation of a potential trough in which electrons can be permanently trapped.

6 Claims, 1 Drawing Sheet

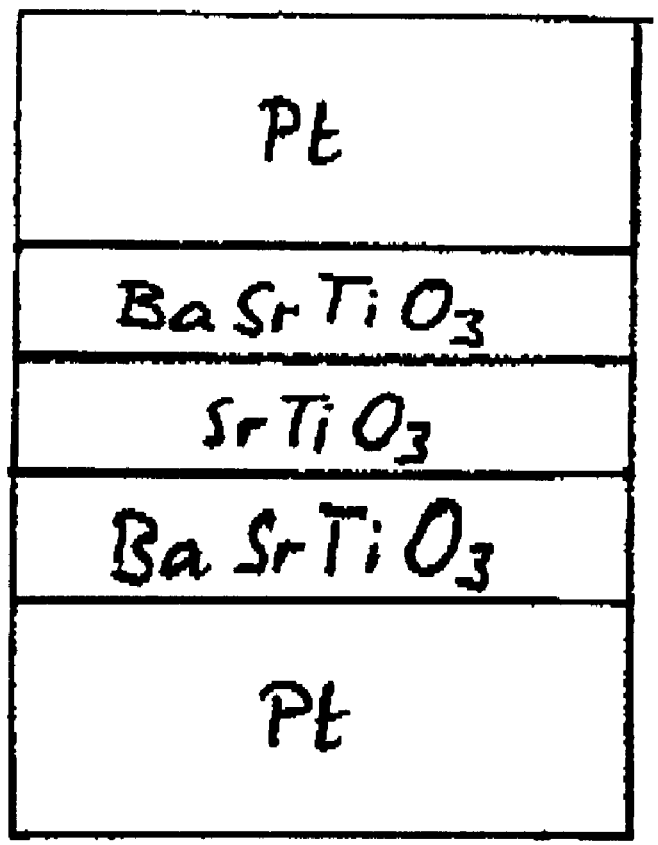

DRAM MEMORY CAPACITOR HAVING THREE-LAYER DIELECTRIC, AND METHOD FOR ITS PRODUCTION

CROSS-REFERENCE TO RELATED APPLICATION

This is a continuation of copending International Application PCT/DE99/01977, filed Jul. 1, 1999, which designated the United States.

BACKGROUND OF THE INVENTION

Field of the Invention

The present invention relates to a DRAM memory capacitor having a dielectric which is disposed between two electrodes and contains $BaSrTiO_3$ (BST) and to a method for producing such a DRAM memory capacitor.

As is known, BST is a "high-$\epsilon$ material" which is regarded as being particularly promising for use as a dielectric for DRAM memory capacitors owing to its maximum possible electrical charge density, which is, for example, approximately ten times as great as that of silicon nitride. An additional advantageous feature of BST in this case is that its scaling with regard to the layer thickness and operating voltage is well below that for silicon nitride.

It is known from the reference by H. Reisinger et al., titled "Dielectric Breakdown, Reliability and Defect Density of $(Ba_{0.7}Sr_{0.3})TiO_3(BST)$", the VLSI Symposium 98, that the maximum density of the electrical charge on BST, and thus its minimum layer thickness for a given operating voltage is not limited by leakage currents but, in fact, by the electrical breakdown voltage and the life to breakdown and thus, in the end, by the reliability of the BST.

When configuring the life expectancy of a dielectric that is subject to electrical loads, the trapping of electrons plays a significant role. For example, it is known from the reference by, W. Hönlein et al., titled "ONO Technology", Applied Surface Science 39 (1989), pages 178–191, that electrons may be trapped as permanently as possible in ONO (oxide-nitride-oxide) structures with layer thicknesses of, for example, 5 nm, 8 nm, 5 nm which leads to a reduced current and thus to an increased life and to a lower defect rate as a consequence of a self-healing mechanism of weak points.

In the specialist world, the expression trapping of charge carriers is understood to be the trapping of charge carriers in a potential well or potential trough. The term is also used in this sense here.

The significance of trapping is now explained. Once a voltage has been applied to a BST layer via electrodes, electrons are trapped in this layer, resulting in the current decreasing as a function of time. Thus, owing to the reduced current, the trapped electrons have an advantageous effect on the life. However, if the polarity of the electrical voltage on the electrodes is reversed, the trapped electrons are "detrapped" (or are released from the trapping points), which returns the layer to its original state once again, and increases the current. Continuous reversal of the voltage polarity on the electrodes, as is necessarily the case in a DRAM memory capacitor, thus leads to the life of this capacitor being considerably shortened.

Finally, it is known from the reference by F. Tcheliebon et al., titled "On the Microstructure and Optical Properties of $Ba_{0.5}Sr_{0.5}TiO_3$ Films", Thin Solid Films 299 (1997) 14–17, that the band gap of BST is a function of the barium content.

SUMMARY OF THE INVENTION

It is accordingly an object of the invention to provide a DRAM memory capacitor, and a method for its production, that overcomes the above-mentioned disadvantages of the prior art devices and methods of this general type, which has a BST dielectric and is distinguished by a long life.

With the foregoing and other objects in view there is provided, in accordance with the invention, a dynamic random access memory (DRAM) capacitor. The capacitor includes two electrodes and a dielectric containing BaSrTiO$_3$ (BST) disposed between the two electrodes. The dielectric is formed of at least three layers with a middle layer functioning as a potential well for trapping electrons.

In the case of the DRAM memory capacitor of the type mentioned initially, the object is achieved according to the invention in that the dielectric has at least three layers, with the middle layer representing a potential well for trapping electrons.

During operation of the memory capacitor, trapped charge carriers, in particular electrons, are held permanently in the potential well, that is to say in the middle layer, so that they are not released even if the memory capacitor polarity is reversed a number of times. In consequence, the life of the memory capacitor is considerably increased.

The potential well can be formed by the dielectric being in the form of a triple layer. However, n layers (n≧4) may also be provided, instead of three layers. It is preferable for a triple layer to be symmetrical in its width/thickness direction. In this case, two outer layers may be composed of $BaSrTiO_3$ and a middle layer may be composed of $BaSrTiO_3$ with a proportion of Ba and/or Ti which is less than that in the outer layers. The potential well is thus produced by the variation of the Ba and/or Ti content of the middle layer with respect to the outer layers.

The triple layer may have a layer thickness of approximately 50 nm, with the individual layers having layer thicknesses of approximately 17 nm. However, in general, layer thicknesses of 5–30 nm are possible.

In the DRAM memory capacitor according to the invention and whose dielectric constant $\epsilon$ ($200<\epsilon<500$) is only slightly dependent on Ba/Sr and/or Ti, the thickness equivalent to silicon dioxide is only a few Angström (Å).

Pt, for example, may be used for the electrodes of the memory capacitor. However, other materials are also possible.

The method according to the invention for producing the DRAM memory capacitor is distinguished in that the dielectric is produced by CVD (deposition from the gas phase) or by sputtering, and in that once each layer has been deposited, a heat treatment in the form of a tempering or annealing step is carried out in oxygen ($O_2$). Thus, for example, Ba/Sr and/or Ti contents of the precursors are changed during CVD, while the target is switched over during sputtering. This allows the desired change in the layer stoichiometry to be produced in a simple manner.

Other features which are considered as characteristic for the invention are set forth in the appended claims.

Although the invention is illustrated and described herein as embodied in a DRAM memory capacitor, and a method for its production, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWING

The single FIGURE of the drawing is a schematically illustrated layer sequence of a DRAM memory capacitor and its energy levels according to the invention.

DESCRIPTION OF THE PREFERRED EMBODIMENTS

Referring now to the single FIGURE of the drawing in detail, there is shown located between two electrodes composed of Pt with a Fermi level $E_F$, a triple layer formed of two outer layers composed of $BaSrTiO_3$ with a lower edge $E_c$ of the conductance band and an upper edge $E_v$ of the valency band, and a middle layer composed of $SrTiO_3$ (possibly with a small proportion of Ba). As a consequence of its stoichiometry with a proportion of Ba (or Ti) which is low in comparison to that of the outer layers, the middle layer forms a potential well in which the trapped electrons are held permanently, so that they cannot be released, and remain permanently trapped, even if the polarity of the memory capacitor is reversed a number of times. The reduced current flow that this causes allows the life of the memory capacitor to be considerably increased.

The described memory capacitor can be produced in a simple manner by chemical vapor deposition (CVD) or sputtering, with the grain growth being interrupted after production of each individual layer by a tempering or annealing step, so as to prevent the creation of current paths along grain boundaries.

We claim:

1. A dynamic random access memory (DRAM) capacitor, comprising:

two electrodes; and a dielectric containing $BzSrTiO_3$ (BST) and disposed between said two electrodes, said dielectric formed of three layers with a middle layer functioning as a potential well for trapping electrons, said three layers including two outer layer composed of $BaSrTiO_3$ and said middle layer composed of $SrTiO_3$.

2. The DRAM capacitor according to claim 1, wherein said three layers are symmetrical in a thickness direction.

3. The DRAM capacitor according to claim 1, wherein said two electrodes are composed of Pt.

4. The DRAM capacitor according to claim 1, wherein said three layers have a combined layer thickness of approximately 50 nm.

5. The DRAM capacitor according to claim 4, wherein a layer thickness of each of said three layers is approximately 17 nm.

6. The DRAM capacitor according to claim 1, wherein each layer of said three layers has a layer thickness of between 5 and 30 nm.

* * * * *